(12) United States Patent
Cheng et al.

(10) Patent No.: US 6,776,226 B1
(45) Date of Patent: Aug. 17, 2004

(54) ELECTRONIC DEVICE CONTAINING THERMAL INTERFACE MATERIAL

(75) Inventors: Chih-Min Cheng, Westford, MA (US); Andrew Collins, Amherst, NH (US)

(73) Assignee: National Starch and Chemical Investment Holding Corporation, New Castle, DE (US)

(*) Notice: Subject to any disclaimer, the term of this patent is extended or adjusted under 35 U.S.C. 154(b) by 0 days.

(21) Appl. No.: 10/388,031

(22) Filed: Mar. 12, 2003

(51) Int. Cl.[7] .............................. F28F 7/00; H05K 7/20
(52) U.S. Cl. ..................... 165/185; 165/905; 361/704
(58) Field of Search .................. 165/185, 80.2, 165/80.1, 80.3, 905; 361/704, 705, 707, 708, 709; 524/543, 544, 545

(56) References Cited

U.S. PATENT DOCUMENTS

| | | | |
|---|---|---|---|
| 4,051,100 A | * 9/1977 | Bjerk et al. .................. 523/153 |
| 4,576,845 A | 3/1986 | Krotchko |
| 5,010,038 A | * 4/1991 | Fox et al. .................... 438/106 |
| 5,143,761 A | * 9/1992 | Chiotis et al. ............. 428/35.1 |
| 5,275,887 A | * 1/1994 | Johnson et al. ............. 428/422 |
| 5,480,930 A | * 1/1996 | Gentle et al. ................ 524/414 |
| 5,545,473 A | 8/1996 | Ameen et al. |
| 5,591,034 A | 1/1997 | Ameen et al. |
| 5,738,936 A | * 4/1998 | Hanrahan ................. 428/313.5 |
| 5,741,855 A | * 4/1998 | Kaduk et al. ................. 525/88 |
| 5,904,978 A | 5/1999 | Hanrahan et al. |
| 5,945,217 A | 8/1999 | Hanrahan |
| 6,090,491 A | 7/2000 | Tan et al. |
| 6,097,598 A | 8/2000 | Miyahara et al. |
| 6,203,873 B1 | 3/2001 | Shifman et al. |
| 6,210,789 B1 | 4/2001 | Hanrahan |
| 6,255,581 B1 | 7/2001 | Reis et al. |
| 6,391,442 B1 | * 5/2002 | Duvall et al. ................ 428/348 |
| 6,410,630 B1 | * 6/2002 | Hoover et al. .............. 524/365 |

* cited by examiner

Primary Examiner—Henry Bennett
Assistant Examiner—Tho V Duong
(74) Attorney, Agent, or Firm—Charles W. Almer

(57) ABSTRACT

A thermal interface member in a heat generating, electronic device is provided. The thermal interface member comprises either a single fluoroelastomer or a blend of fluoroelastomer components that are copolymers of hexafluoropropylene and vinylidene and consists of greater than 40% fluorine along the backbone, and one or more conductive fillers. The fluoroelastomer blend contains at least one component with a Mooney viscosity of 50 poise or less and at least one component with a Mooney viscosity of greater than 50 poise, while the single fluoroelastomer component may have a Mooney viscosity of either less than or greater than 50.

16 Claims, 1 Drawing Sheet

ELECTRONIC DEVICE CONTAINING THERMAL INTERFACE MATERIAL

FIELD OF THE INVENTION

This invention relates to a thermally conductive material that is utilized to transfer heat from a heat-generating electronic device to a cold sink that absorbs and dissipates the transferred heat.

BACKGROUND OF THE INVENTION

Electronic devices, such as those containing semiconductors, typically generate a significant amount of heat during operation. In order to cool the semiconductors, cold sinks are typically affixed in some manner to the device. In operation, heat generated during use is transferred from the semiconductor to the cold sink where the heat is harmlessly dissipated. In order to maximize the heat transfer from the semiconductor to the cold sink, a thermally conductive thermal interface material is utilized. The thermal interface material ideally provides an intimate contact between the cold sink and the semiconductor to facilitate the heat transfer. Commonly, either a paste-like thermally conductive material, such as silicone grease, or a sheet-like thermally conductive material, such as silicone rubber is utilized as the thermal interface material.

Both the current paste-like and sheet-like thermally conductive materials have drawbacks that present obstacles during their use. For example, while some paste-like materials provide low thermal resistance, they must be applied in a liquid or semi-solid state and thus require manufacturing controls in order to optimize their application. In addition to enhanced controls during application, the handling of the paste-like materials can be difficult. Difficulties in utilizing existing materials include controls upon reapplication for pastes, migration of grease to unwanted areas, and reworkability for phase change materials or thermoset pastes. Traditional thermal interface films address the handling and application problems of pastes, however they typically have a higher thermal resistance as compared to pastes. Thus, it would be advantageous to provide a thermal interface material that is easy to handle and apply, yet also provides a low thermal resistance.

SUMMARY OF THE INVENTION

A composition for use as a thermal interface material in a heat-generating, semiconductor-containing device is provided. The composition comprises a blend of fluoroelastomer components that are copolymers of hexafluoropropylene and vinylidene and consists of greater than 40% fluorine along the backbone. The blend contains at least one component with a Mooney viscosity of 50 poise or less and at least one component with a Mooney viscosity of greater than 50 poise.

Another aspect of the present invention provides an electronic device containing a heat-generating component, a cold sink and a thermal interface material according to the above description.

DETAILED DESCRIPTION OF THE PREFERRED EMBODIMENTS

Figure 1:
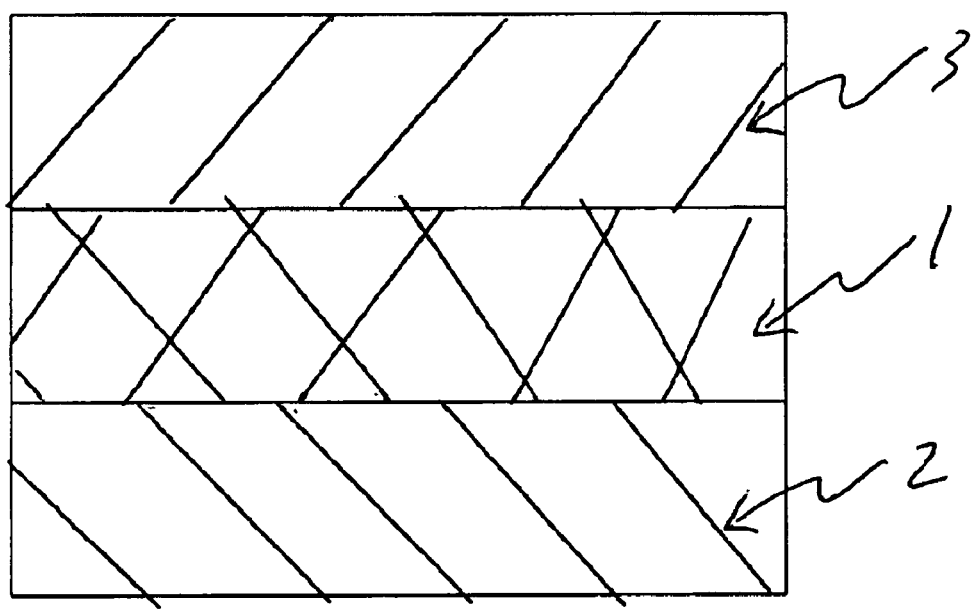
FIG. 1 his a side view of a heat-generating device, film and cold sink.

As used herein, the term Mooney viscosity is defined pursuant to ASTM Standard Test Methods for rubber viscosity as the shearing torque resisting rotation of a cylindrical metal disk (or rotor) embedded in rubber within a cylindrical cavity. The term viscosity as used in these test methods is not a true viscosity, but rather a measure of shearing torque averaged over a range of shearing rates. The term gum is used to define fluoroelastomers without cross linkers.

The material of the present invention may be utilized with virtually any heat-generating component for which it is desired to dissipate the heat. In particular, the thermal interface material is useful for aiding in the dissipation of heat from heat-generating components in semiconductor devices. In such devices, as shown in FIG. 1, the thermal interface material 1 forms a layer between the heat-generating component 2 and the cold sink 3 and transfers the heat to be dissipated to the old sink.

The thermal interface material comprises base resins that are a blend of fluoroelastomers that provide reduced thermal resistance when combined with thermally conductive particles. The fluoroelastomer components blended together are preferably copolymers of hexafluoropropylene and vinylidene fluoride that consist of greater than 40% and most preferably 60% fluorine along the backbone. Fluoroelastomers are currently commercially available in 65–69% and 71% fluorinated grades, however those skilled in the art would appreciate that other fluorinated grades could be utilized with the present invention. The fluoroelastomers are typically chosen for their chemical resistance and are available as raw gums (with no curing agent) or with a cure agent already incorporated. Fluoroelastomers are often preferable to standard rubber elastomers in that they have better heat, chemical and light resistance in an uncured state. Either terpolymers or dipolymers may be utilized as desired. In addition, it is preferable that the fluoroelastomers be soluble in organic solvents because the films are commonly cast in solvent to avoid the necessity of extruding the films. Depending upon the composition it may also be desirable to form the films via hot melt extrusion. The blend of fluoroelastomer components consists of at least one component having a Mooney viscosity of 50 poise or less and at least one component having a Mooney viscosity of greater than 50 poise. In a preferred embodiment, approximately equal parts of the high and low Mooney viscosity fluoroelastomers components are blended together. In certain electronic applications a composition having a fluoroelastomer component with a Mooney viscosity entirely greater than 50 poise may be utilized. The base resin fluoroelastomers of the material may be classified as gum, but are not limited to thermoplastic gums. Further, the material is preferably not cross-linked. Preferably the material is blended such that the fluoroelastomers retain their flexibility at high particle loading and so that the material retains its properties under accelerated stress testing.

The low viscosity component of the blend provides the property of good surface wetting under heat and/or pressure to the material. As the low viscosity component is conformable under heat and/or pressure, the thermal interface material will be similar in performance to a phase change material. Preferably, the low viscosity component will allow the thermal interface material to have a wetting capability similar to that of a liquid.

Various materials may be utilized as the low viscosity component of the thermal interface material blend. One preferred material is FC2211. commercialized by Dyneon LLC. Other materials having low Mooney viscosity that may be utilized in the blend include low viscosity, non-incorporated cure agents FC2210X, FC2145, FE5522X, and FE5832X (Dyneon). Also available are copolymers such as N215, N535, N605K and NM, terpolymers such as TN50A and TN50S, high fluorine elastomers such as PFR91 and PFR94 and peroxide curable gum such as P457 and P459 (all commercialized by Ausimont).

The high Mooney viscosity component of the blend provides the thermal interface material with good handling and compression set properties. The high viscosity component causes the blend to have properties different than a phase change material in that the material retains its physical integrity until it is exposed to the upper use temperature. This attribute eliminates pumpout, a common reliability phenomenon associated with existing grease and phase change materials.

Various materials may be utilized as the high viscosity component of the thermal interface material blend. Preferred materials include N935, P959, and PL956 (Ausimont) and FC2178, FC2261Q and FC2260 (Dyneon). A preferred material having high Mooney viscosity that may be utilized in the blend is FC2178.

The combination of the high and low viscosity elastomers will produce a material having sufficient integrity to be a solid at room temperature and properties of a low viscosity material. Thus, the resulting material will be suitable for use as a tape or film and will provide good surface wetting. The material is capable of wetting substrates with high surface energy, such as metals, and low surface energy, such as plastics due to the low surface energy of the fluorinated elastomer blend. Further, due to the combination of the two elastomers the resulting material is reworkable and can be easily removed from a substrate after application without the use of solvent or heat This property is unique as compared to other thermal interface materials that offer low thermal resistance. The thermal interface materials of the present invention are also unique in that they provide a thin film with low thermal resistance. In contrast, grease thermal interface materials provide low thermal resistance, but require dispensing. A further benefit of the thermal interface materials of the present invention is that they are reworkable without heat or solvents, thus allowing reworking in any location. Typically, the use of this material would require external support, such as clamping. Finally, in the form of a film the thermal interface material of the present invention will not flow to any unwanted areas of the substrate to which it is being applied. In addition, a pressure sensitive adhesive may be applied to the film in order to provide sufficient tack to hold the film in position during application.

The fluoroelastomer materials may be cured with numerous known materials, including peroxides and amines. Methods of curing include press cure and autoclave cure. A wide range of cure conditions are possible, depending upon the time, temperature and pressure applied during cure. Commonly, the cure temperature is within the range of about 150C to about 210C and curing takes place for less than 60 minutes. In autoclave curing, a pressure may be applied of at least 100 psig in order to reduce the potential blistering of the rubber. Other components that affect the cure schedule are polymer blend, cure system, acid acceptor, filler system and part configuration.

In addition to the fluoroelastomer blend, the thermal interface material further comprises thermally conductive particles. These particles may be either electrically conductive or nonconductive. The conductive particles may comprise any suitable thermally conductive material, including silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon black, graphite, boron nitride-coated particles and mixtures thereof. Preferably, the conductive particles are silver flakes.

The thermal interface material of the invention preferably comprises between about 25–85 volume % of a fluoroelastomer having a Mooney viscosity of greater than 50 poise and about 25–85 volume % of a fluoroelastomer having a Mooney viscosity of 50 poise or less. The thermal interface material of the invention most preferably comprises between about 50–80 volume % of a fluoroelastomer having a Mooney viscosity of greater than 50 poise and about 50–80 volume % of a fluoroelastomer having a Mooney viscosity of 50 poise or less. The material preferably comprises in the range of about 5 to about 75 volume % conductive particles and most preferably in the range of about 20 to about 50 volume % conductive particles.

In addition to the conductive particles, additives may be included in the formulation to provide desired properties. Various additives that may be included are silane functional perfluoroether, phosphate functional perfluoroether, silanes, titanates and other low molecular weight polymers that offer surface affinity and polymer compatibility.

The invention is further illustrated by the following non-limiting examples:

EXAMPLE 1

Four thermal interface materials were made comprising a fluoroelastomer or fluoroelastomer blend, and silver. The process for making the thermal Interface materials involved pre-dissolving the rubber components in an organic solvent of known solid content. Next, the rubbers were blended for twenty minutes under a high-speed dispersator blade. Silver was added to the solution and the solution was mixed for an additional twenty minutes. During the last ten minutes of the silver-resin mixing the surface active agents were added. Also during the mix procedure MEK is added to maintain the viscosity at an appropriate coating viscosity. The mixture was then evacuated under low pressure to remove any entrapped air and then coated at the desired thickness using a standard knife over roll technique. Finally, the film is placed at approximately 70–80C for a sufficient time to remove the solvent, usually about twenty to thirty minutes. The compositions of the materials are illustrated in Table 1.

TABLE 1

Compositions of Thermal Interface Materials (in wt %)

| Formulation | A | B | C | D |
|---|---|---|---|---|
| 2178 | 10 | 5 | | |
| 2211 | | 5 | 10 | |
| N935 | | | | 10 |
| Silver | 90 | 90 | 90 | 90 |
| Mooney Viscosity | 100 | 60 | 20 | 60 |

These materials were tested for the resistance via steady state testing and the results are illustrated in Table 2.

TABLE 2

Resistance of Thermal Interface Materials

| Formulation | Thickness (mils) | Resistance Run 1 (cm^2-K/W) | Resistance Run 2 | Resistance Run 3 |
|---|---|---|---|---|
| A | 3.5 | 0.39 | 0.36 | 0.34 |
| B | 3.5 | 0.28 | 0.26 | 0.25 |
| C | 3.0 | 0.31 | 0.28 | 0.27 |
| D | 3.5 | 0.34 | 0.31 | 0.30 |

As shown in Table 2, the blend of the high and low Mooney viscosity materials, Formulation B, provides the material with the lowest resistance. Formulation A, containing only a high Mooney viscosity material provides the highest resistance while Formulation C, containing only a low Mooney viscosity material provides a relatively low resistance. Formulation C, however, will not be optimum in that it flows too much and thus does not maintain a sufficient pressure between the two substrates. Further, even though the total Mooney viscosity for Formulation D should be the same as that of Formulation B, the blended material of Formulation B provides a lower resistance than the single elastomer formula of Formulation D.

EXAMPLE 2

Five thermal interface materials were made according to the procedure of Example 1 and comprising a fluoroelastomer or fluoroelastomer blend, silver, and various additives. The compositions of the materials are illustrated in Table 3.

TABLE 3

Compositions of Thermal Interface Materials (in wt %)

| Formulation | E | F | G | H | I |
|---|---|---|---|---|---|
| N935 | 9 | 8.6 | 8.6 | 8.6 | |
| 2178 | | | | | 4.3 |
| 2211 | | | | | 4.3 |
| Silver | 91 | 91 | 91 | 91 | 91 |
| S10 | | 0.5 | | 0.2 | 0.2 |
| F10 | | | 0.5 | 0.2 | 0.2 |
| Mooney Viscosity | 60 | 60 | 60 | 60 | 60 |

S10 - silane functional perfluoroether additive, commercially available from Ausimont
F10 - phosphate functional perfluoroether additive, commercially available from Ausimont The results of testing on Formulations E–I are illustrated in Table 4.

TABLE 4

Resistance of Thermal Interface Materials containing Additives

| Formulation | Thickness | Resistance Run 1 | Resistance Run 2 | Resistance Run 3 |
|---|---|---|---|---|
| E | 3.5 | 0.342 | 0.313 | 0.300 |
| F | 3.5 | 0.405 | 0.376 | — |
| G | 3.5 | 0.277 | 0.268 | 0.267 |
| H | 3.7 | 0.265 | 0.253 | 0.245 |
| I | 3.9 | 0.229 | 0.219 | — |

As shown in Table 4, the formulations containing surface active agents as additives may affect the resistance of the formulation. Further, the blended formulation containing additives had a lower resistance than any of the non-blended formulations.

EXAMPLE 3

The formulation of composition I was formulated with either silver or varying amounts of boron nitride. The compositions of the four materials are illustrated in Table 5.

TABLE 5

Thermal Interface Materials with Varying Fillers (wt %)

| Formulation | I | J | K | L |
|---|---|---|---|---|
| Resin | 9 | 40 | 37 | 35 |
| Boron Nitride | — | 60 | 63 | 65 |
| Ag | 91 | — | — | — |

Formulations I–L were tested for the resistance via laser flash testing and the results are illustrated in Table 6.

TABLE 6

Resistance and Conductivity of Thermal Interface Materials

| Formulation | I | J | K | L |
|---|---|---|---|---|
| Resistance (cm^2-K/W) | 0.15 | 0.76 | 0.63 | 0.57 |
| Conductivity (W/mK) | 6.7 | 1.4 | 1.3 | 1.4 |

As shown in Table 6, the use of boron nitride as a filler provides satisfactory conductivity and resistance.

Many modifications and variations of this invention can be made without departing from its spirit and scope, as will be apparent to those skilled in the art. The specific embodiments described herein are offered by way of example only, and the invention is to be limited only by the terms of the appended claims, along with the full scope of equivalents to which such claims are entitled.

We claim:

1. An electronic device comprising a heat-generating member, a cold sink for dispersing heat generated by the heat-generating member, and a thermally conductive member in intimate contact between the heat-generating member and the cold sink, wherein the thermally conductive member comprises at least one first fluoroelastomer having a Mooney viscosity of greater than 50 poise, at least one second fluoroelastomer having a Mooney viscosity of 50 poise or less, and thermally conductive particles, and wherein at least one fluoroelastomer is capable of forming an unsupported film.

2. The device of claim 1, wherein the first and second fluoroelastomers are copolymers of hexafluoropropylene and vinylidene fluoride and consist of greater than 40% fluorine along their backbone.

3. The device of claim 2, wherein the first and second fluoroelastomers are copolymers of hexafluoropropylene and vinylidene fluoride and consist of greater than 60% fluorine along their backbone.

4. The device of claim 1, wherein the first and second fluoroelastomers are soluble in organic solvents.

5. The device of claim 2, wherein the thermally conductive member is formed via hot melt extrusion.

6. The device of claim 2, wherein the thermally conductive member comprises in the range of about 25 volume % to about 85 volume % of the fluoroelastomer having a Mooney viscosity greater than 50 poise.

7. The device of claim 6, wherein the thermally conductive member comprises in the range of about 50 volume % to about 80 volume % of the fluoroelastomer having a Mooney viscosity greater than 50 poise.

8. The device of claim 2, wherein the member comprises in the range of about 25 volume % to about 85 volume % of the fluoroelastomer having a Mooney viscosity 50 poise or less.

9. The device of claim 8, wherein the thermally conductive member comprises in the range of about 50 volume % to about 80 volume % of the fluoroelastomer having a Mooney viscosity 50 poise or less.

10. The device of claim 1, wherein the conductive particles comprise silver, gold, nickel, copper, metal oxides, boron nitride, alumina, magnesium oxides, zinc oxide, aluminum, aluminum oxide, aluminum nitride, silver-coated organic particles, silver plated nickel, silver plated copper, silver plated aluminum, silver plated glass, silver flakes, carbon black, graphite, boron nitride-coated particles and mixtures thereof.

11. The device of claim 10, wherein the thermally conductive member comprises in the range of about 5 volume % to about 75 volume % conductive particles.

12. The device of claim 11, wherein the thermally conductive member comprises in the range of about 20 to about 50 volume % conductive particles.

13. The device of claim 2, wherein the thermally conductive member further comprises one or more of the group consisting of silane functional perfluoroether, phosphate functional perfluoroether, silanes, titanates, and mixtures thereof.

14. The device of claim 1, wherein the thermally conductive member is in the form of a supported film.

15. The device of claim 1, further comprising a pressure sensitive adhesive.

16. The device of claim 1, wherein the thermally conductive member is in the form of a free-standing film.

* * * * *